United States Patent
Begin et al.

[11] Patent Number: 5,310,410
[45] Date of Patent: May 10, 1994

[54] METHOD FOR PROCESSING SEMI-CONDUCTOR WAFERS IN A MULTIPLE VACUUM AND NON-VACUUM CHAMBER APPARATUS

[75] Inventors: Robert G. Begin, Montecito; Peter J. Clarke, Santa Barbara, both of Calif.

[73] Assignee: Sputtered Films, Inc., Santa Barbara, Calif.

[21] Appl. No.: 807,162

[22] Filed: Dec. 13, 1991

Related U.S. Application Data

[63] Continuation of Ser. No. 505,596, Apr. 6, 1990, abandoned.

[51] Int. Cl.5 .................. C23C 14/00; C23C 16/00; C23C 13/08
[52] U.S. Cl. .................. 29/25.01; 204/192.1; 204/298.25; 204/298.35; 118/719; 118/729; 414/217
[58] Field of Search .......... 29/25.01; 118/719, 729; 204/192.1, 298.25, 298.26, 298.35; 414/217, 221, 786

[56] References Cited

U.S. PATENT DOCUMENTS

| 4,592,306 | 6/1986 | Gallego ................. 118/719 |
| 4,816,098 | 3/1989 | Davis et al. ............. 118/729 |
| 4,825,808 | 5/1989 | Takahashi et al. ........ 118/719 |
| 4,917,556 | 4/1990 | Stark et al. ............. 414/217 |
| 4,951,601 | 8/1990 | Maydan et al. ........... 118/729 |
| 5,076,205 | 12/1991 | Vowles et al. ........... 118/719 |
| 5,186,718 | 2/1993 | Tepman et al. ........... 29/25.01 |

Primary Examiner—Olik Chaudhuri
Assistant Examiner—David E. Graybill
Attorney, Agent, or Firm—Ellsworth R. Roston; Charles H. Schwartz

[57] ABSTRACT

A method wherein wafers are transferred between a loading chamber and a central vacuum chamber. A plurality of first vacuum processing chambers are disposed in a satellite relationship around the central chamber. A plurality of second non-vacuum chambers are interspersed with the first chambers in a satellite relationship around the central chamber. A second central vacuum chamber communicates with one of the first chambers through a valve. Third and fourth pluralities of chambers are disposed in a satellite relationship around the second central chamber to respectively perform functions similar to those performed by the first and second chambers, the fourth chambers being interspersed with the third chambers.

11 Claims, 3 Drawing Sheets

METHOD FOR PROCESSING SEMI-CONDUCTOR WAFERS IN A MULTIPLE VACUUM AND NON-VACUUM CHAMBER APPARATUS

This is a continuation of application Ser. No. 505,596 filed Apr. 6, 1990, now abandoned.

This invention relates to apparatus for processing wafers which are fabricated to provide semi-conductor chips. More particularly, the invention relates to apparatus for disposing a plurality of chambers in a satellite arrangement around a central station to facilitate the processing of the wafers, some of the satellite chambers being at the same pressure as the central chamber and others being at a pressure different from the central chamber.

Semiconductors have become accepted as a basic commodity in present day society. For example, they are used in all forms of equipment including computers and data processing equipment, automobiles and television receivers. With every passing year, new uses are found for semiconductors. The number of semiconductors manufactured each year is progressively multiplying at a very high rate.

Semiconductors are fabricated in the form of wafers which can contain as many as thousands of dies on a single wafer. Each die may contain a plurality of different layers of conductive material separated from one another by insulating layers and disposed in patterns which are interrelated and interconnected with the patterns of conductivity in the other layers to define complex electrical circuitry. The dies on the wafers are tested individually and the dies passing these tests are then processed and packaged to form individual semi-conductor chips.

Expensive equipment is used to fabricate the wafers. For example, loading chambers have to be provided to load wafers into the fabricating equipment and to transfer the wafers from the fabricating equipment after the wafers have been fabricated. Equipment also has to be provided to deposit uniform layers of a material in the different layers on the semi-conductor chip. These layers may be formed from a material providing electrical insulation between the electrical layers or may be formed from a material having an electrical conductivity. The material having the electrical conductivity may be then processed to produce the unique patterns which in composite define the complex electrical circuitry. The equipment for depositing the layers of material on the wafer operate in a vacuum since air would inhibit the formation of layers with uniform characteristics.

The equipment now in use for fabricating wafers generally include a plurality of chambers each being provided to perform a different function such as to deposit a different material on the wafer or to remove electrical material from an electrically conductive surface to produce a unique pattern of electrically conductive material on the surface. Generally each of these chambers provides a vacuum individual to that chamber.

In the fabrication of wafers, some process steps are performed which generally do not require a vacuum individual to any angle chamber. For example, it is sometimes desired to test the dies on the wafer after a coating has been deposited on the wafer. As another example, it is also sometimes desired to anneal a coating after the coating has been deposited on a wafer. It is also sometimes desired to melt a coating after the formation of the coating so that the thickness of the coating will become even more uniform than that provided by the deposition of the coating. Generally such steps are now performed in chambers which have vacuums individual to such chambers.

This invention provides a system which is more flexible than the systems of the prior art.

In one embodiment of the invention, wafers may be transferred between a loading chamber and a central chamber constructed to receive a vacuum. A plurality of first chambers are disposed in a satellite relationship around the central chamber. Valves may be disposed between the central chamber and each of the first chambers to provide for the production of an individual vacuum in the first chambers. The wafers may be processed in each of the first chambers such as by depositing a substantially uniform coating of a material on the wafers.

A plurality of second chambers may be interspersed with the first chambers in the satellite relationship around the central chamber. Individual vacuums are not provided in such chambers. Processing may be performed in the second chambers such as by inspecting or annealing a coating previously deposited in one of the first chambers or melting such deposition to assure that the thickness of the coating is uniform.

In another embodiment, a second central chamber constructed to receive a vacuum may communicate with a particular one of the first chambers through a valve. Third and fourth pluralities of chambers respectively corresponding to the first and second chambers may be disposed in a satellite relationship around the second central chamber to respectively perform functions similar to those performed by the first and second chambers, the fourth chambers being interspersed with the third chambers. In this way, the waters may be transferred between the first and second central chambers and may be processed in the chambers around these central chambers in an arrangement providing great flexibility in the types of operations performed.

Figure 1:
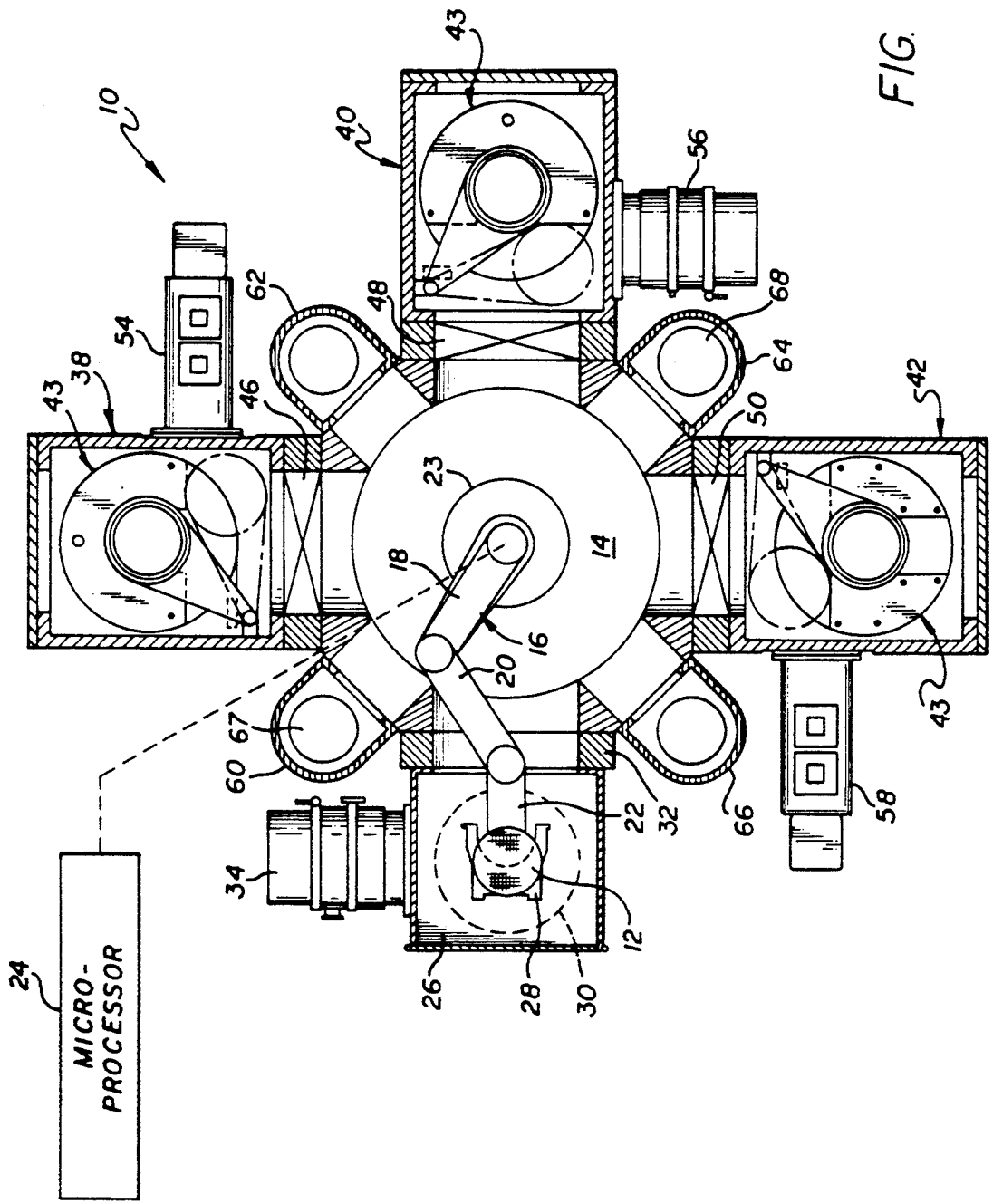
FIG. 1 is a top plan view of apparatus constituting one embodiment of the invention for processing semiconductor wafers.

In one embodiment of the invention, apparatus generally indicated at 10 (FIG. 1) is provided for processing a wafer 12. A central chamber 14 is included in the apparatus 10. A robot assembly generally indicated at 16 is disposed in the central chamber 14 and is provided with a plurality of arms 18, 20 and 22 which are pivotable relative to one another by a drive mechanism 23 (FIG. 2) under the control of a microprocessor 24 (FIG. 1). The arms 18, 20 and 22 and the drive mechanism 23 may be constructed in a conventional manner to move the wafer 12 to any position within the apparatus 10. Other forms of robots than that provided by the arms 18, 20 and 22, the drive mechanism 23 and the microprocessor 24 may be provided.

A turbomolecular pump 25 (FIG. 2) and a cryogenic pump 27 may be operatively coupled to the central chamber 14. The turbomolecular pump 25 and the cryogenic pump 27 may be constructed in a conventional manner. The turbomolecular pump 25 is advantageous in removing gases (including argon) other than water vapor from the central chamber 14 since these gases do not occur in great volume and the turbomolecular pump 25 with its limited speed is able to remove such gases from the chamber. For example, the turbomolecular pump 25 is able to pump at a rate of approximately three thousand liters (3000 l.) per second. The turbomolecular pump may start at atmospheric pressure gas and may pump to the low $10^{-7}$ torr range of backed by a proper mechanical pump.

In contrast, the cryogenic pump 27 is able to pump at an approximate rate of twenty thousand (20,000) liters per second. The cryogenic pump 27 is especially effective in removing water vapor from the central chamber 14 since water vapor constitutes most of the gases in the chamber. Liquid nitrogen tubes 27 may be associated with the cryogenic pump 27 to provide the liquid nitrogen. Gases including water vapor are not desirable in the processing apparatus 10 since they contaminate the depositions of material on the surface of the wafer 12.

A loading chamber 26 is disposed in contiguous relationship to the central chamber 14. The loading chamber 26 may be constructed in a conventional manner. It may include a wafer cassette 28 for holding a plurality of wafers in stacked relationship and an elevator mechanism 30 for raising and lowering the wafer cassette 28. The elevator mechanism 30 is raised or lowered to a level so that an individual one of the wafers 12 can be transferred between the loading chamber 26 and the central chamber 14.

A valve 32 is disposed between the loading chamber 26 and the central chamber 14. In the open position, the valve provides for a communication between the loading chamber 26 and the central chamber 14. This may occur when the wafer 12 is transferred between the central chamber 14 and the loading chamber 26. The valve 32 may be disposed in the closed position when the wafer 12 is being transferred between the loading chamber 26 and a position outside of the loading chamber. A vacuum pump 34 may be coupled to the loading chamber 26 to produce a vacuum in the loading chamber 26 when the valve 32 is closed. The vacuum pump 34 may be a turbomolecular pump or a cryogenic pump. The vacuum pump 34 may be operated to produce a vacuum in the loading chamber 26 before a wafer 12 is transferred from the loading chamber 26 to the central chamber 14.

The elimination of the water vapor in the central chamber 14 is advantageous in comparison to what has been done in the prior art. One way of eliminating the water vapor in the prior art has been to heat the wafer to a high temperature. Some equipments of the prior art have heated the wafer in the loading chamber 26. This is an expensive and perhaps destructive process to perform in the loading chamber 26 because the cassette 28 and the elevator loading mechanism 30 have to be especially constructed to operate at high temperatures. Furthermore, all of the area in the loading chamber 26 has to be heated. This means that "O" ring surfaces in the elevator mechanism 30 have to be water cooled or special materials have to be used for the "O" rings. These high temperature materials have been expensive and difficult to use.

A plurality of processing chambers 38, 40 and 42 are disposed in a satellite relationship around the periphery of the central chamber 14. The processing chambers 38, 40 and 42 are disposed in a spaced relationship to one another and define at least partially a closed loop around the periphery of the central chamber 16. Valves 46, 48 and 50 are respectively disposed between the central chamber 14 and the processing chambers 38, 40 and 42. The valves 46, 48 and 50 may be constructed in a manner similar to the construction of the valve 32.

Vacuum pumps 54, 56 and 58 may be respectively associated with the processing chambers 38, 40 and 42. The vacuum pumps 54, 56 and 58 may correspond in construction to the turbomolecular pump 25 or to a cryogenic pump. It will be appreciated that other types of vacuum pumps than turbomolecular pumps and cryogenic pumps may be used.

The processing chambers 38, 40 and 42 perform certain important functions when pumps are disposed in the chambers and gases have been evacuated from the chambers by such pumps. For example, layers of an insulating material such as silicon dioxide or of an electrically conductive material such as copper or titanium can be deposited on the wafer 12 when a vacuum has been produced in the individual chambers 38, 40 and 42. Processing apparatus generally indicated at 43 may be associated with each of the chambers 38, 40 and 42 to provide such processing. The processing apparatus 43 may be constructed in a manner well known in the art.

When pumps are not disposed in individual ones of the processing chambers 38, 40 and 42, such individual chambers may be exposed to the atmosphere. Photolithography or etching may illustratively be performed by the processing apparatus 43 on the wafers in such chambers and the wafers may then be passed back to the central chamber 14 for introduction to other ones of the processing chambers 38, 40 and 42 for further metallization.

In certain steps in the process of forming a wafer, the wafer can be processed in a chamber which does not have to be isolated from the central chamber 16. For example, after a layer of a material such as copper or titanium has been deposited on the wafer, it is often desirable to anneal the coating so as to provide the coating with substantially uniform properties. As another example, it is sometimes desirable to melt the coating so that the coating will run and any imperfections or non-linearities in the thickness of the coating will be removed. These process steps can be performed in a chamber not isolated from the central chamber.

A further example of processing the wafer 12 in a chamber not isolated from the central chamber 16 is to inspect the wafer after it has been processed in one of the vacuum chambers 38, 40 and 42. If the wafer does not pass inspection, this may indicate that the wafer is defective or that the apparatus 10 or a portion of the apparatus 10 is defective. No matter what the problem is, the apparatus 10 has to be shut down until the problem has been isolated. The waters fabricated now are so expensive that, if inspection stations are not provided, the apparatus will fail as a production tool for sputter coating.

To provide the functions discussed above, satellite chambers 60, 62, 64 and 66 are disposed in a satellite relationship around the periphery of the central chamber 14. The chambers 60, 62, 64 and 66 are interspersed with the chambers 38, 40 and 42, preferably in an alternate relationship with the chambers 38, 40 and 42. The chambers 60, 62, 64 and 66 are adapted to be disposed at the same pressure as the central chamber 14 since no valves are disposed between the chambers 60, 62, 64 and 66 and the central chamber 14 and no pumps are separately associated with the chambers 60, 62, 64 and 66. In this way, the inspection of the wafers or the annealing or melting of a coating on the wafer can be accomplished in the chambers 60, 62, 64 and 66. Inspecting apparatus is schematically shown at 67 in the chamber 60 and heating apparatus is schematically shown at 68 in the chamber 64.

Figure 2:
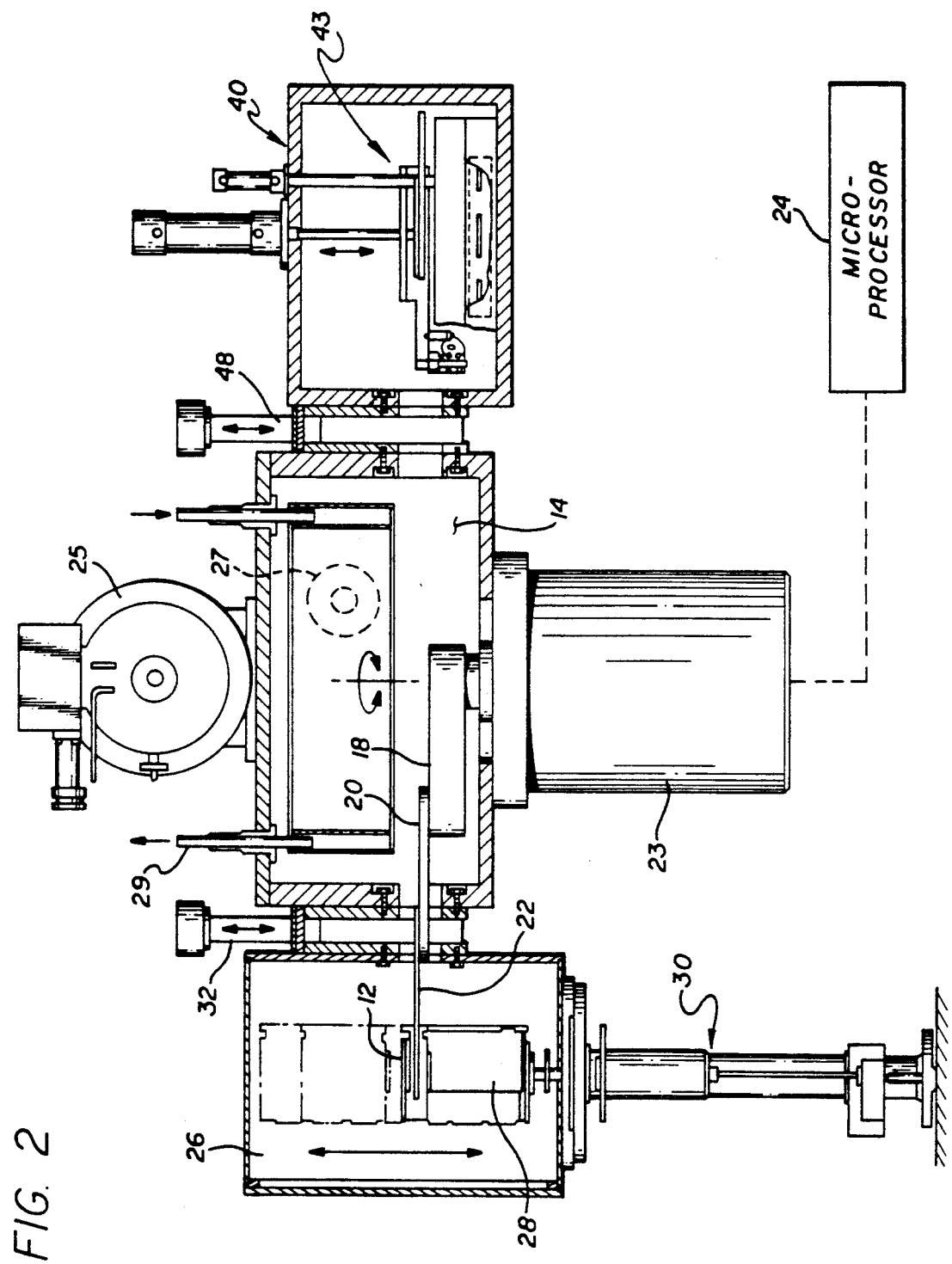
FIG. 2 is a front elevational view of the apparatus shown in FIG. 1.

In the embodiment shown in FIGS. 1 and 2, the wafers may be loaded into the loading chamber 26 and then transferred by the robot assembly 16 into the central chamber 14. The wafers may then be processed in the chambers 60, 38, 62, 40, 64, 42 and 66. The wafers may thereafter be transferred from the central chamber 14 into the loading chamber 26 for transfer out of the loading chamber.

Figure 3:
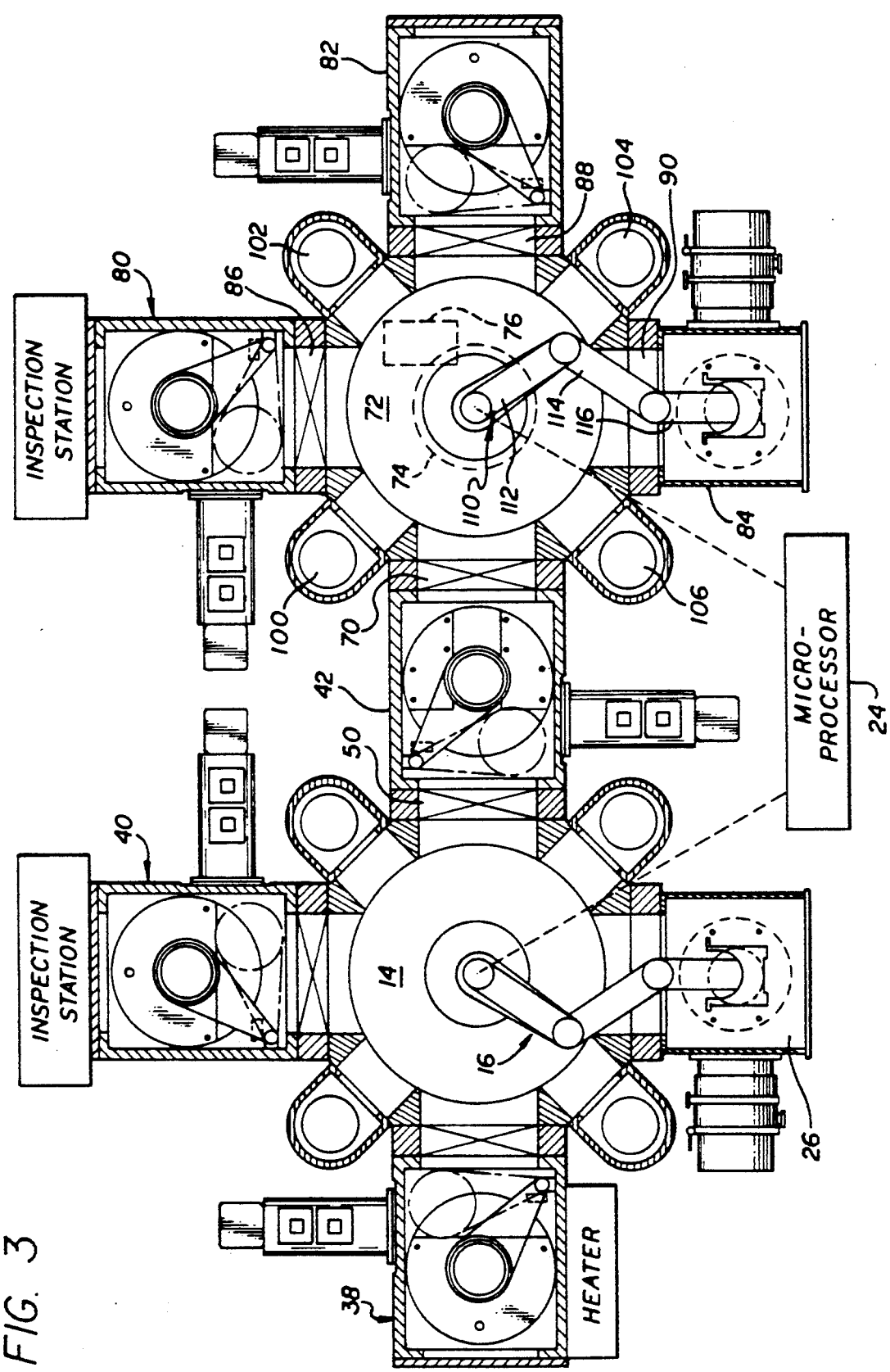
FIG. 3 is a top plan view of a second embodiment of the invention.

FIG. 3 illustrates another embodiment of the invention. In this embodiment, a valve 70 is disposed at the end of the processing chamber 42 furthest removed from the central chamber 14. The valve 70 may be constructed in a manner similar to the construction of the other valves such as the valve 48. The valve 70 may be disposed between the processing chamber 42 and a second central chamber 72. The central chamber 72 may be constructed in a manner similar to the central chamber 14. A turbomolecular pump 74 and a cryogenic pump 76 may be associated with the central chamber 72 in a manner similar to the association of the turbomolecular pump 25 and the cryogenic pump 27 with the central chamber 14.

A plurality of processing chambers 80, 82 and 84 are disposed in a satellite relationship around the central chamber 72. The disposition of the processing chambers 80, 82 and 84 relative to the central chamber 72 corresponds substantially to the disposition of the processing chambers 38, 40 and 42 relative to the central chamber 14. Valves 86, 88 and 90 may be respectively disposed between the processing chambers 80, 82 and 84 and the central chamber 72. Vacuum pumps 92, 94 and 96 may be respectively associated with the chambers 80, 82 and 84 to produce a vacuum in the associated chambers when the respective ones of the valves 86, 88 and 90 are closed. The chambers 80, 82 and 84 are used in a manner similar to the chambers 38, 40 and 42 to deposit material such as silicon, copper or titanium on the wafer 12. The processing may be provided by processing apparatus such as the processing apparatus 43.

A plurality of chambers 100, 102, 104 and 106 are also disposed in a satellite relationship around the periphery of the central chamber 72. The chambers 100, 102, 104 and 106 are preferably interspersed with the chambers 80, 82 and 84. No valve is disposed between any of the chambers 100, 102, 104 and 106 and the central chamber 72. The chambers 100, 102, 104 and 106 operate in a manner similar to the chambers 60, 62, 64 and 66 to perform such functions as inspecting the wafers or annealing or melting coatings on the wafers.

A robotic assembly generally indicated at 110 may be disposed in the central chamber 72 and may be provided with a plurality of arms 112, 114 and 116 in a manner corresponding to the arms 18, 20 and 22 included in the robotic assembly 16. The robotic assembly 110 is able to transfer wafers between the central chamber 72 and the different chambers including the chambers 40, 80, 82 and 84 and the chambers 100, 102, 104 and 106.

In the embodiment shown in FIG. 3, the wafers may be loaded into the loading chamber 26 and then transferred by the robotic assembly 16 into the central chamber 14. The wafers may then be processed in the chambers 60, 38, 62 and 40 and may be transferred by the robotic assembly 110 from the chamber 40 to the central chamber 72. The wafers may then be processed in the chambers 100, 80, 102, 82, 104, 84 and 106 and may be transferred by the robotic assembly 110 back to the chamber 40. The wafers may be subsequently transferred from the chamber 40 back into the central chamber 14 and may be further processed in the chambers 64, 42 and 66. The wafers may thereafter be transferred from the central chamber 14 into the loading chamber 26 for transfer out of the loading chamber.

Although it has been disclosed above that the pumps 74 and 76 may be disposed in the central chamber 72, the pumps may also be exposed to the atmosphere. When the central chamber 72 is exposed to the atmosphere, processing of the wafer 12 may occur in a protected environment such as argon. When the central chamber 72 is at atmospheric pressure, the pressure in the chamber 42 is changed between vacuum and atmospheric in accordance with the transfer of the wafer between the central chambers 14 and 72.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. A method of processing a wafer to produce dies on the wafer, including the following steps;

disposing a second chamber adjacent a first chamber for providing for a transfer of the wafer between the first chamber and the second chamber, disposing a plurality of third chambers in a satellite relationship with the second chamber such that the third chambers define an at least partially closed loop around the second chamber for providing for a transfer of the wafer between the second chamber and each of the third chambers, providing for the production of a vacuum pressure in each of the third chambers, interspersing a plurality of fourth chambers with the third chambers in the satellite relationship with the second chamber where the fourth chambers define at least partially closed loops with the third chambers around the second chamber, and loading the wafer in the first chamber and transferring the wafer to the second chamber, transferring the wafer at atmospheric pressure from the second chamber to individual ones of the third chambers, performing individual ones of processes at a vacuum pressure on the wafer in the individual ones of the third chambers upon the transfer of the wafer to such individual ones of the third chambers, the vacuum processes constituting steps in the method of producing dies on the wafer, transferring the wafer from the individual ones of the third chambers to the central station after the performance of the individual ones of the processes at the vacuum pressure in such individual ones of the third stations, transferring the wafer at atmospheric pressure, in second steps alternate with the first steps, from the second chamber to individual ones of the fourth chambers, performing individual ones of processes at atmospheric pressure on the wafer in the individual ones of the fourth chambers upon the transfer of the wafer to such individual ones of the fourth chambers, transferring the wafer from the individual ones of the fourth chambers to the second chamber after the performance of the individual ones of the processes at atmospheric pressure on the wafer in such individual ones of the fourth chambers.

2. A method as set forth in claim 1, including the following steps;

producing a vacuum in the individual ones of the third chambers after the transfer of the wafer from the second chamber to the individual ones of the third chambers, and producing atmospheric pressure in the individual ones of the third chambers before the transfer of the wafer from such individual ones of the third chambers to the second chamber.

3. A method as set forth in claim 2, including the following steps;

producing atmospheric pressure in the second chamber before the transfer of the wafer from the second chamber to the individual ones of the third chambers, and maintaining the atmospheric pressure in the second chamber during and after the transfer of the wafer from the second chamber to the individual ones of the fourth chambers and the transfer of the wafer from such individual ones of the fourth chambers to the second chamber.

4. A method as set forth in claim 3, including the following steps;

providing a fifth chamber, and transferring the wafer from the second chamber to the fifth chamber after the processing of the wafer in the individual ones of the third and fourth chambers.

5. A method as set forth in claim 4 wherein individual ones of the processes of etching the surface of the wafer and depositing a layer of material on the surface of the wafer are performed at the vacuum pressure in the individual ones of the third chambers, and individual ones of the processes of annealing, surface melting and inspecting the wafer are performed at atmospheric pressure in individual ones of the fourth chambers.

6. A method of processing a wafer to produce dies on the wafer, including the following steps;

providing a transfer of the wafer between a central chamber and individual ones of first chambers disposed in a satellite relationship around the central station, evacuating the individual ones of the first chambers to a vacuum pressure after the transfer of the wafer from such central chamber to such individual ones of such first chambers, performing individual ones of functions on the wafer at the vacuum pressure in the individual ones of the first chambers, transferring the wafer at atmospheric pressure from the individual ones of the first chambers to the central chamber after the performance of the functions at the vacuum pressure in such individual ones of the first chambers, providing a transfer at atmospheric pressure between the central chamber and individual ones of second chambers disposed in the satellite relationship around the central chamber in interspersed relationship with the first chambers, performing individual ones of functions at atmospheric pressure on the wafer in the individual ones of the second chambers, and providing a transfer at atmospheric pressure from the individual ones of the second chambers to the central chamber after the performance of the individual ones of the atmospheric pressure functions at atmospheric pressure in such individual ones of such second chambers.

7. A method as set forth in claim 6 wherein the functions at the vacuum pressure include individual ones of etching the surface of the wafer and depositing a layer of material on the surface of the wafer, and the functions at atmospheric pressure include individual ones of annealing the surface of the wafer, melting the surface of the wafer and inspecting the surface of the wafer.

8. A method as set forth in either of claims 6 or 7 including the steps of;

initially transferring the wafer from a loading chamber to the central chamber before the performance of the functions at the vacuum pressure on the wafer in the first chambers and the performance of the functions at atmospheric pressure on the wafer in the second chamber, and transferring the wafer from the central chamber to an unloading chamber after the performance of the functions at the vacuum pressure on the wafer in the first chambers and the performance of the functions at atmospheric pressure on the wafer in the second chambers.

9. A method as set forth in claim 8 wherein the central chamber is at atmospheric pressure.

10. A method as set forth in claim 9 wherein the first and second chambers are alternately disposed in a closed loop around the central station.

11. A method as set forth in claim 1 including the following steps;

providing a fifth chamber, disposing a plurality of sixth chambers in a satellite relationship with the fifth chamber where the sixth chambers define an at least partially closed loop around the fifth chamber for providing for a transfer of the wafer between the fifth chamber and each of the sixth chambers, providing for the production of a vacuum pressure in each of the sixth chambers, interspersing a plurality of seventh chambers with the sixth chambers in the satellite relationship with the fifth chamber where the seventh chambers define an at least partially closed loop with the sixth chambers around the fifth chamber, one of the third chambers being common with one of the sixth chambers, transferring the wafer through the common chamber from the second chamber to the fifth chamber, transferring the wafer at atmospheric pressure from the fifth chamber to individual ones of the sixth chambers, performing individual ones of the processes at the vacuum pressure in the individual ones of the sixth chambers upon the transfer of the wafer to such individual ones of the sixth chambers, transferring the wafer at atmospheric pressure from the individual ones of the sixth chambers to the fifth chamber after the performance of the individual ones of the processes at the vacuum pressure in such individual ones of the sixth chambers, transferring the wafer at atmospheric pressure to individual ones of the seventh chambers alternately with the transfer of the wafer to the individual ones of the sixth chambers, performing individual ones of the processes at atmospheric pressure on the wafer in the individual ones of the seventh chambers upon the transfer of the wafer to such individual ones of the seventh chambers, and transferring the wafer at atmospheric pressure from the individual ones of the seventh chambers to the fifth chamber after the performance of the individual ones of the processes at atmospheric pressure on the wafer in such individual ones of the seventh chambers.

* * * * *